(12) United States Patent
Vandermeulen et al.

(10) Patent No.: US 7,566,866 B2
(45) Date of Patent: Jul. 28, 2009

(54) SYSTEMS AND METHODS FOR A TILTED OPTICAL RECEIVER ASSEMBLY

(75) Inventors: Mark Vandermeulen, Hamilton (CA); Robert E. Hawke, St. Williams (CA); David Roy, Port Colborne (CA); William F. Hill, Braintree (GB)

(73) Assignee: Gennum Corporation (CA)

( * ) Notice: Subject to any disclaimer, the term of this patent is extended or adjusted under 35 U.S.C. 154(b) by 66 days.

(21) Appl. No.: 11/852,506

(22) Filed: Sep. 10, 2007

(65) Prior Publication Data

US 2009/0065678 A1 Mar. 12, 2009

(51) Int. Cl.
*H01J 40/14* (2006.01)
(52) U.S. Cl. .................................. 250/239; 250/214.1
(58) Field of Classification Search ................. 250/239, 250/214.1, 216; 257/80–85, 433–436, 737–739, 257/777–780; 438/613; 385/39, 34, 49, 385/58, 88, 92
See application file for complete search history.

(56) References Cited

U.S. PATENT DOCUMENTS

| | | | |
|---|---|---|---|
| 6,418,033 B1 | 7/2002 | Rinne | |
| 7,007,833 B2 | 3/2006 | Mackay et al. | |
| 7,007,835 B2 | 3/2006 | Deane et al. | |
| 7,110,033 B2 | 9/2006 | Miyake | |
| 7,309,904 B2 * | 12/2007 | Naito et al. | 257/421 |

* cited by examiner

*Primary Examiner*—Que T Le
(74) *Attorney, Agent, or Firm*—Jones Day

(57) ABSTRACT

Systems and methods are provided for depositing solder in a first pattern over a first bonding pad on the substrate; depositing solder in a second pattern over a second bonding pad on the substrate, wherein the second pattern defines a larger area than the first pattern; placing the electronic device on the substrate such that pads on the electronic device are aligned with the first and second bonding pads; and reflowing the solder between the pads on the electronic device and the first and second bonding pads, causing the solder deposited on the first bonding pad to form a first solder joint and the solder deposited on the second bonding pad to form a second solder joint. The second solder joint is larger than the first solder joint causing the electronic device to be attached at an angle relative to the substrate.

6 Claims, 5 Drawing Sheets

SYSTEMS AND METHODS FOR A TILTED OPTICAL RECEIVER ASSEMBLY

FIELD

The technology described in this patent document relates generally to bonding electronic devices to a substrate. More particularly, it relates to a tilted optical receiver assembly and a method for making the assembly.

BACKGROUND AND SUMMARY

Optical receiver modules are used for receiving high-speed (e.g., GHz) optical data signals propagating along an optical fiber. Typically, within these optical receiver modules there is an optical detector electrically coupled to an amplifier circuit in such a manner that light from the optical fiber illuminates the optical detector, the optical detector generates photocurrent in response thereto, and the amplifier circuit amplifies this photocurrent.

As light enters the optical receiver module from the optical fiber, some of this light reflects off the receiver and bounces back into the fiber. This back-reflected light deteriorates the overall performance of the optical transmission network.

In accordance with the teachings described herein, systems and methods are provided for attaching an electronic device to a substrate. The method comprises depositing solder in a first pattern over a first bonding pad on the substrate; depositing solder in a second pattern over a second bonding pad on the substrate, wherein the second pattern defines a larger area than the first pattern; placing the electronic device on the substrate such that pads on the electronic device are aligned with the first and second bonding pads; and reflowing the solder between the pads on the electronic device and the first and second bonding pads, causing the solder deposited on the first bonding pad to form a first solder joint and the solder deposited on the second bonding pad to form a second solder joint. The second solder joint is larger than the first solder joint causing the electronic device to be attached at an angle relative to the substrate. As used herein a "pattern" need not have repeating units, and may consist of one or more units.

An optical receiver module is provided that includes an optical detector having a first set of bonding pads, and a substrate that includes a second set of bonding pads. The optical detector is attached to the substrate by solder joints formed between the first and second sets of bonding pads. The solder joints include a first set of solder joints and a second set of solder joints. The second set of solder joints is larger than the first set of solder joints, thereby causing the optical detector to be attached at an angle with respect to the substrate. As used herein, a "set" may have one or more than one member.

An optical detection device includes an optical device and a substrate. The optical device is attached to the substrate by solder joints formed between the optical device and the substrate. The solder joints include a first set of solder joints and a second set of solder joints. The second set of solder joints are larger than the first set of solder joints, thereby causing the optical device to be attached at an angle with respect to the substrate.

DETAILED DESCRIPTION

A tilted optical detector and method for making it is provided to reduce the deteriorated network performance caused by back-reflected light from the optical detector. The method for tilting the detector can also be applied to other electronic and optical devices.

Back-reflected light can be reduced to some extent by anti-reflection coatings. However, to meet industry specifications for intermediate reach (IR) and long reach (LR) applications, which typically have many more optical discontinuities (splices, splitters, WDM mux/demuxs, etc.), additional measures are required to eliminate back-reflected light. These measures include using an avalanche photodiode, or using an optical layout that decreases the paths of reentry into the fiber. In the latter case, the optical path to the photodiode inside the receiver may be skewed such that light reflected off the PIN diode is directed away from the fiber. The energy density of the optical wavefront is Gaussian though, so the tail of the energy distribution will find its way back to the fiber to some extent. The photodiode may be tilted (e.g. 7 degrees) to further deviate the reflected light away from the fiber to meet the IR and LR standards. Automated manufacturing of tilted assemblies is a challenge, because standard pick-and-place robotic assemblers are better suited for placing components on level planes.

The tilted photodiode assembly provides an elegant solution to reduce back-reflected light sufficiently to meet the IR and LR standards. The optical detector is attached to an integrated circuit by providing one side of the detector with a taller soldered connection than the opposite side, yet the technique of assembling the apparatus still allows for automated placement of the detector on a level plane.

Figure 1:
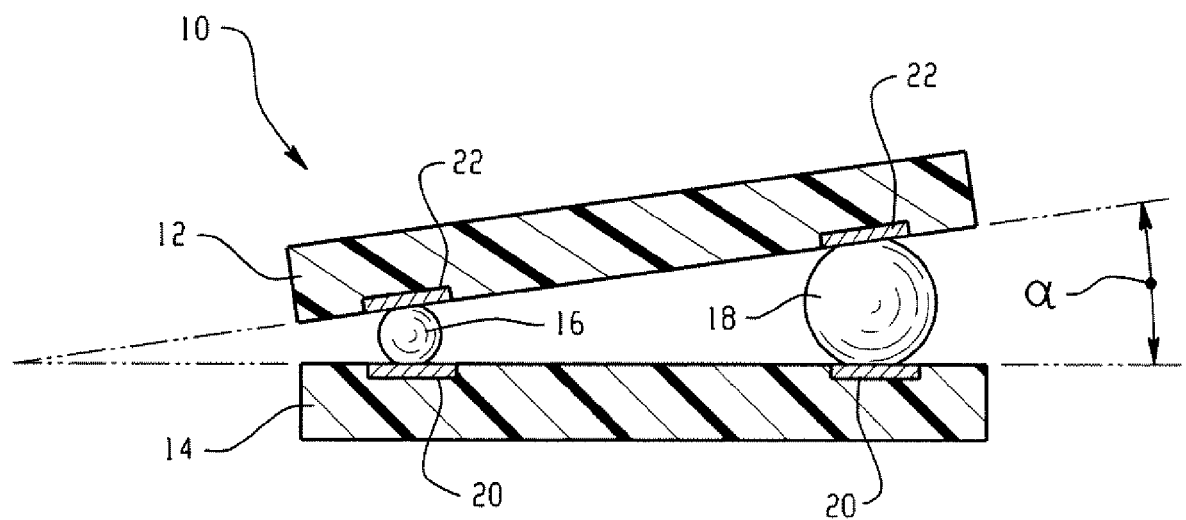
FIG. 1 is a cross-sectional diagram depicting an integrated circuit package attached at a controlled angle to a substrate.

FIG. 1 is a cross-sectional diagram 10 depicting an integrated circuit (IC) package 12 attached at a controlled angle ($\alpha$) to a substrate 14. The controlled angle ($\alpha$) between the IC package 12 and the substrate 14 is formed by controlling the respective sizes of solder joints 16, 18 that attach the IC package 12 to the substrate 14. For instance, in the example shown in FIG. 1, the IC package 12 is attached at an angle ($\alpha$) with respect to the substrate 14 by forming solder joint(s) 18 on the right-hand side of FIG. 1 that have a larger diameter than the solder joint(s) 16 on the left-hand side of FIG. 1. The solder joints 16, 18 may be formed, for example, using flip-chip bonding techniques as described below with reference to FIGS. 2A and 2B. It should be understood that the substrate 12 may be any type of device or material on which an IC package 12 can be solder bonded, such as a carrier substrate, wafer, die, printed circuit board, another IC package, or some other suitable device. It should also be understood that although only two solder joints 16, 18 are depicted in the cross-sectional diagram 10 of FIG. 1, the IC package 12 may be attached by a plurality of both the smaller and larger solder joints 16, 18, for example as shown in FIG. 2B.

Figure 2B:
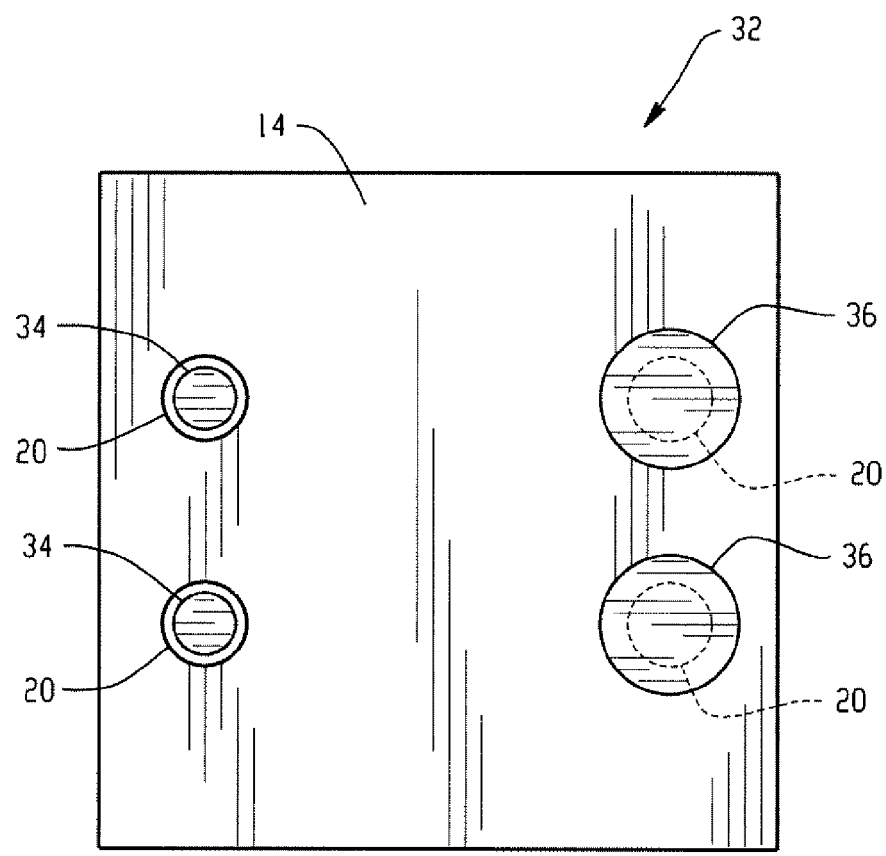
FIGS. 2A and 2B depict an example method for attaching an integrated circuit package to a substrate at a controlled angle.
Figure 2A:
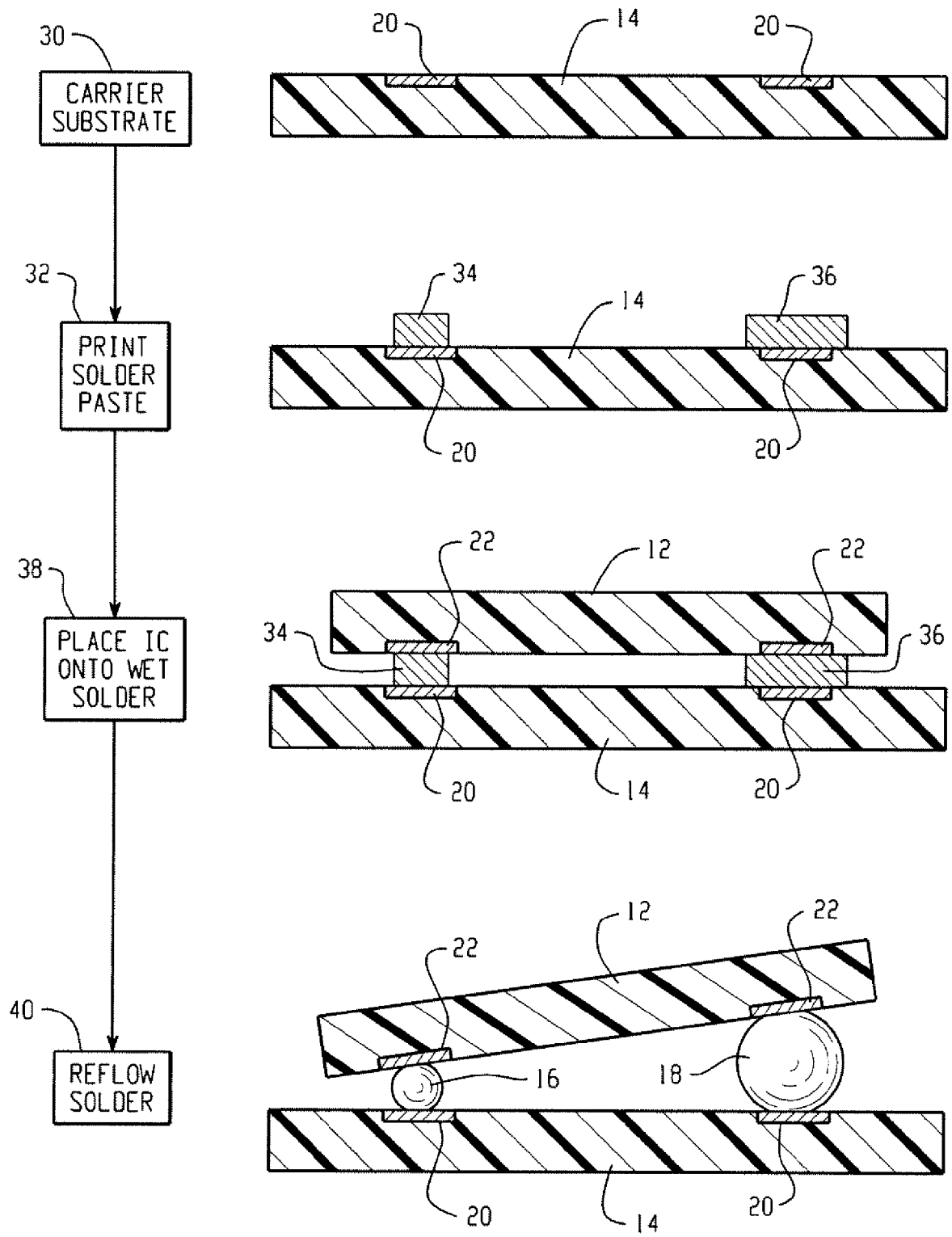

FIGS. 2A and 2B illustrate an example method for forming differently sized solder joints 16, 18 to control the angle ($\alpha$) between the IC package 12 and substrate 14. The angle ($\alpha$)

can be determined by adjusting the heights of the solder spheres, and comparing the difference in height of the low and high spheres. The volume of solder needed for a given sphere height can be determined by the following equation:

Volume=$4/3\pi r^3$; where $r$ is the desired sphere radius, and $2r$ is the desired sphere height.

For example, in a solder screen printing process, the dimensions of the aperatures that are needed to create a sphere of a given height can be determined by using the volume determined by the calculation above.

With reference to FIG. 2A, the left-hand side of the figure depicts a flow diagram of the method, and the right-hand side of the figure depicts example structures resulting from each method step. In step 30, an example carrier substrate 14 is provided. The carrier substrate 14 is provided with bonding pads 20. In step 32, solder paste is screen printed onto the carrier substrate 14, on top of the bonding pads 20. The right-hand solder paste deposits 36 have a larger volume and diameter than the left-hand solder paste deposits 34. In this example, the height of the left- and right-hand printed solder paste deposits 34, 36 are the same or nearly the same. "Nearly the same" is meant to include variations in height due to precision limitations of the manufacturing instruments and techniques, for example, within 1 mil, or for example, a height difference corresponding to a tilt of one degree.

An example solder stencil used to make the solder paste deposits in step 32 has different sized apertures. One row of apertures is larger in diameter than the other row; however, in this example both rows are of the same depth. By using different sized apertures, controlled volumes of solder can be deposited on selected pads on the carrier substrate 14.

In step 38, an integrated circuit 12 is placed onto the solder paste deposits 34, 36 while they are wet. The integrated circuit 12 has bonding pads 22 that align with the solder paste above the corresponding substrate bonding pads 20. An electrical connection is thus formed after reflow between the integrated circuit 12 and the substrate 14. Because the solder paste deposits 34, 36 are the same height, the integrated circuit can be placed onto the wet solder using standard automated pick-and-place equipment.

In step 40 the solder paste deposits 34, 36 are heated to reflow the solder. During the reflow process the solder paste deposits 34, 36 melt and form into the lowest energy state, a sphere. The solder then cools so that the spherical shapes remains. A short left-hand solder sphere 16 and a taller right-hand solder sphere 18 are the result of this process. The integrated circuit 12 is now tilted with the lowest side being supported by the left-hand solder sphere 16 and the highest side being supported by the taller right-hand solder sphere 18. The angle of inclination can be controlled by varying the volume of the solder paste that is printed on the substrate 14 in step 32. As described above, this can be done by controlling the size of the apertures in the solder stencil.

Preferred angles of inclination will depend on the application, and the distance between the optical receiver and the optic fiber. Example angles of inclination include 1-15 degrees, 3-10 degrees and 6, 7, or 8 degrees. By using this example method, repeatable results can be obtained to within plus or minus one degree of inclination.

The example spherical solder joints provide a high-stand-off, low-stress flip chip joint. The example relatively tall flip chip joints permit easy chemical cleaning underneath the flip-chipped die. Furthermore, mounting the integrated circuit with solder joints provides excellent electrical, thermal, and mechanical performance. Additionally, the method is versatile in that it allows various metallurgies of solder paste, e.g. Au/Sn, Pb/Sn, Pb/In, SAC, etc. to be used.

In an alternative example, only two solder joints may be used: one tall one and one short one. Similarly, more than four joints could also be used to mount the integrated circuit. The greater the number of joints, the stronger the bond would be expected to be.

Figure 3:
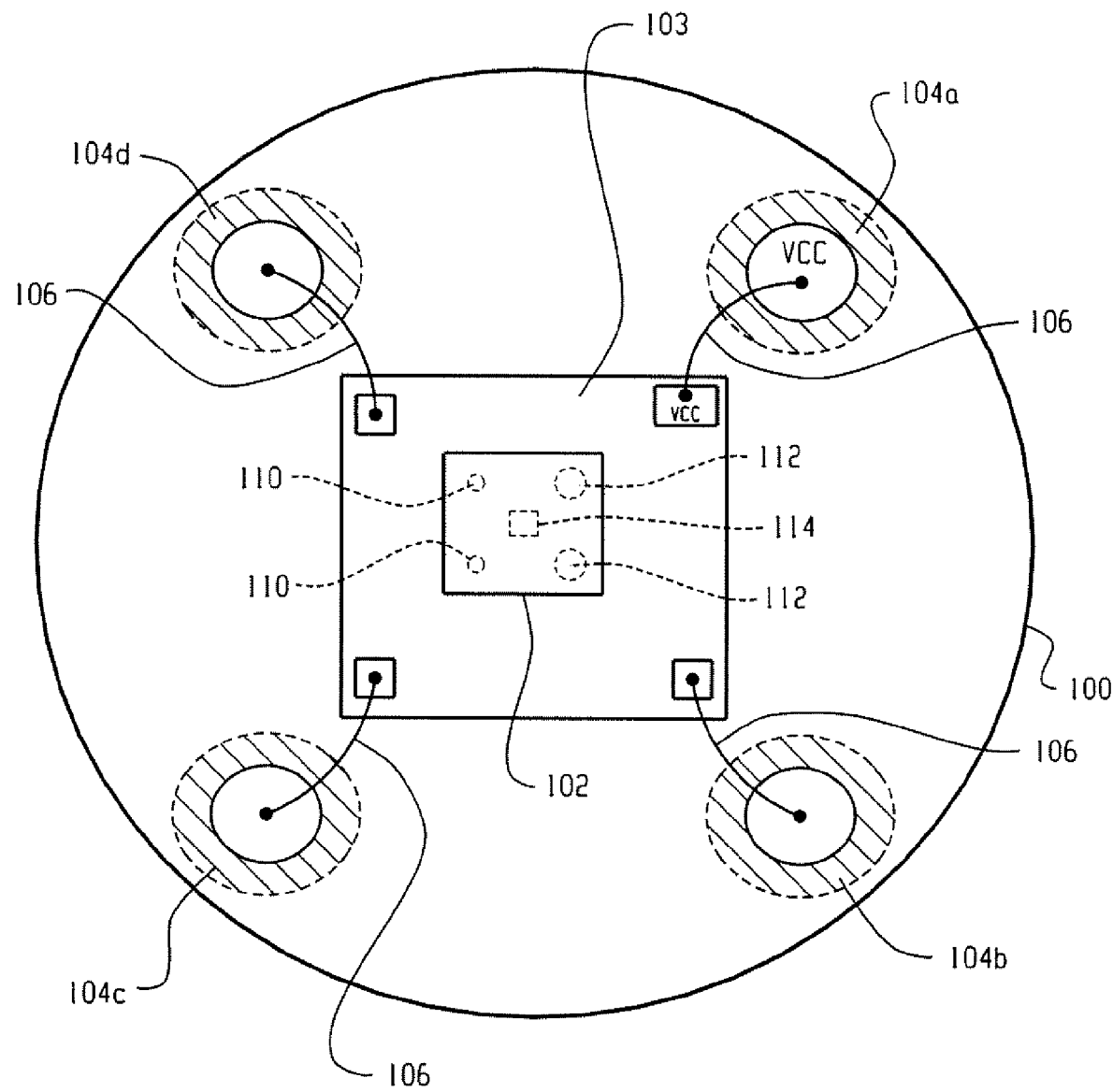
FIG. 3 is an overhead view an example optical receiver module having an optical detector that is attached to an integrated circuit at a controlled angle.
Figure 4:
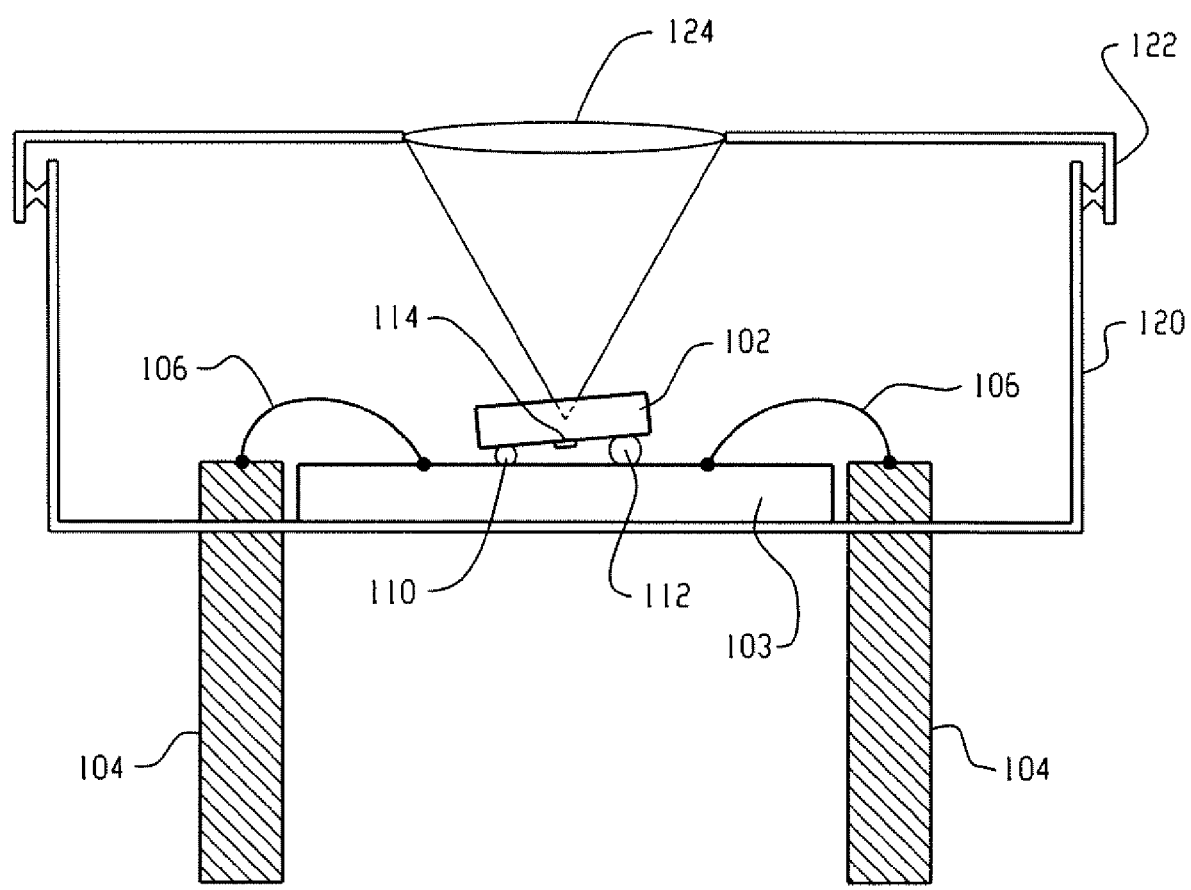
FIG. 4 is a cross-sectional view depicting an example optical receiver module having an optical detector that is attached to an integrated circuit at a controlled angle.
Figure 5:
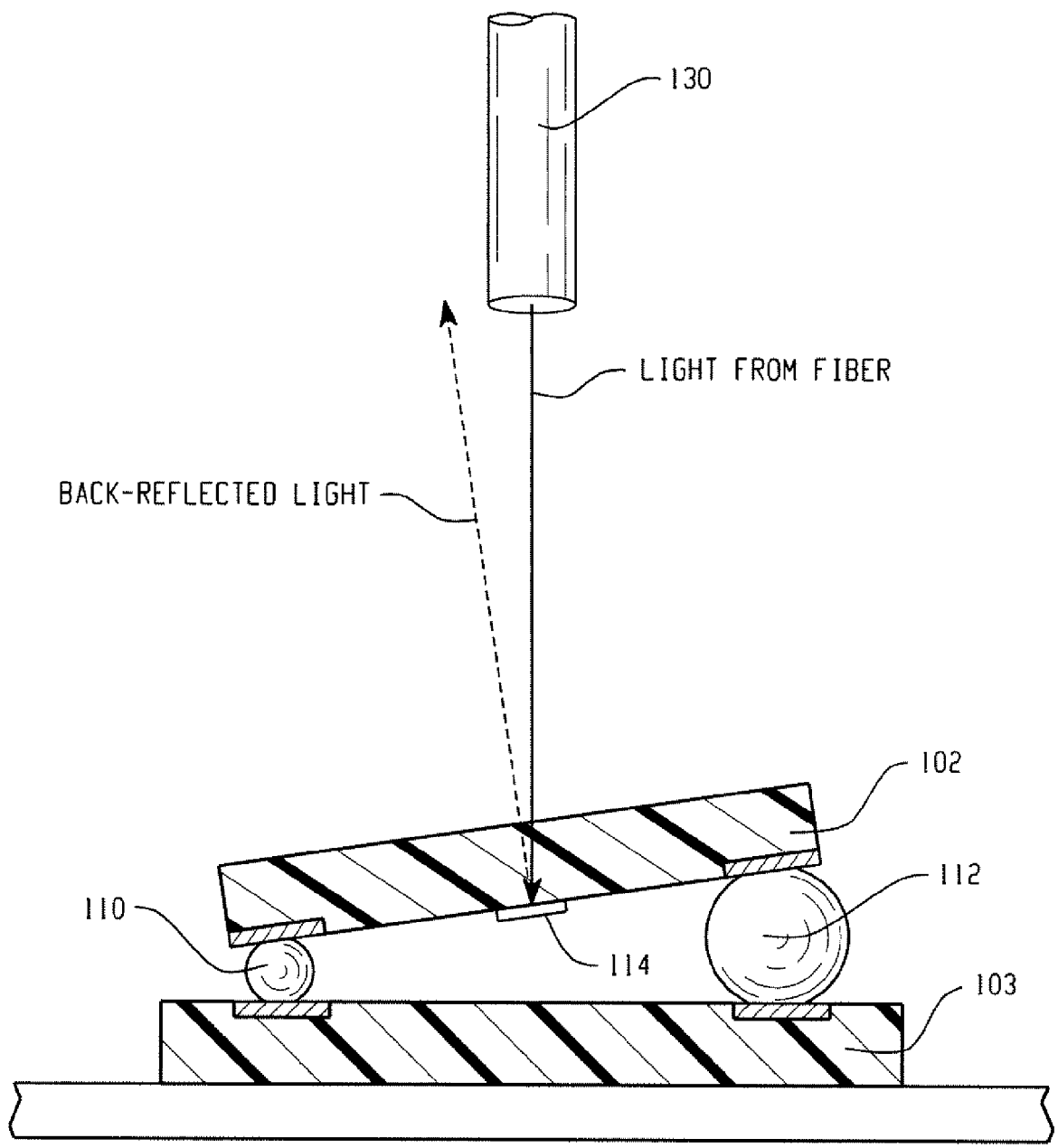
FIG. 5 is a cross-sectional view of an example optical receiver module that includes an optical detector that is attached to an integrated circuit at a controlled angle.

FIGS. 3-5 illustrate an example optical receiver module that includes an optical detector 102 that is attached to an integrated circuit 103 at a controlled angle. The optical detector 102 may, for example, be a PIN diode or APD diode, and the integrated circuit 103 may include an integrated transimpedance amplifier circuit (TiA). The optical detector 102 includes a photosensitive area 114 on the connection side of the optical detector 102, such as a back-illuminated photodiode for detecting long-wavelength light. As illustrated in FIG. 4, a housing 120 including a lid 122, such as a TO-46 package, may be used to enclose the components of the optical receiver. In addition, as shown in FIGS. 3 and 4, a plurality of header pins 104 penetrates the housing and are electrically coupled to the input and output ports of the integrated circuit 102 by bond wires 106.

The integrated circuit 103, for example, may have components and architecture as described in commonly owned U.S. application Ser. No. 11/199,981, filed Aug. 9, 2005, titled "Direct Attach Optical Receiver Module and Method of Testing." For example, the integrated circuit may include an integrated amplifier circuit and at least one integrated capacitor. The integrated circuit may include an input port for receiving the photocurrent. The optical detector may be physically attached to the integrated circuit and the output port of the optical detector may be electrically coupled to the input port of the integrated circuit. The optical detector, integrated amplifier circuit and at least one integrated capacitor may provide a closed loop circuit devoid of any unwanted bondwire inductance allowing an easy path for AC signals.

In another example, an optical receiver module may include an optical detector, and integrated circuit and a redistribution layer. The optical detector may include a photosensor for receiving light and an output port for providing a photocurrent. The integrated circuit may include an input port for receiving the photocurrent. The redistribution layer may include a tuning inductor, which may be physically attached between the optical detector and the integrated circuit. The tuning inductor may be electrically coupled in series between the output port of the optical detector and the input port of the integrated circuit.

The example optical detector 102 is mounted on its bottom-left side by two short solder spheres 110 and on its bottom-right side by two taller solder spheres 112. The solder spheres 110, 112, provide electrical connection between the optical detector 102 and the integrated circuit 103. The spheres 110, 112, for example, may be in electrical connection with bonding pads on the integrated circuit 103 and optical detector 102.

The optical receiver module is optically coupled to an optical fiber 130 (see FIG. 5) via a lens 124 disposed in an aperture formed in the lid 122 of the housing 120. The lens 124 is disposed between an end of the optical fiber 130 that is proximate to the optical receiver module and the optical detector 102. Light from the optical fiber 130 is focused onto the optical detector 102 through the lens 124.

FIG. 5 shows the example optical receiver module including an optical detector 102 that is attached to an integrated circuit 103 at a controlled angle created by the different sized solder spheres 110, 112, and illustrates how the incident light is reflected. The light from the optical fiber 130 hits the photodiode 114 and the back-reflected light is directed away from the optical fiber 130.

Although a back illuminated optical detector is depicted in the drawings a top illuminated optical detector could also be used.

In an alternative embodiment, an optical device, such as a mirror or lens is mounted on a substrate. The optical device is attached to the substrate by solder joints formed between the optical device and the substrate. The solder joints include a first set of solder joints and a second set of solder joints. The second set of solder joints are larger in diameter than the first set of solder joints when printed on the substrate, and in this example have the same or nearly the same height. The level height allows the optical device to be placed by pick-and-place automated machinery. After the solder is reflowed, as described above, the solder rises into spheres of different heights causing the optical device to be attached at an angle with respect to the substrate. This technique can be used to accurately tilt the mirror or lens at a desired angle and direct incoming light to an optical detector that may also be tilted.

This written description uses examples to disclose the invention, including the best mode, and also to enable a person skilled in the art to make and use the invention. The patentable scope of the invention may include other examples that occur to those skilled in the art. For example, an electronic device or optical device could be mounted on a substrate by providing a tall solder sphere on one corner of the electronic device, a short solder sphere on the opposite corner and intermediately sized solder spheres on the other two corners. This would produce a device that is tilted with one corner down and the opposite corner up, with two corners aligned along an axis at an intermediate height. This can be done by the example solder printing, pick-and-place setting, and solder reflow method described above.

It is claimed:

1. An optical receiver module, comprising:
   an optical detector that includes a first set of bonding pads; and
   a substrate that includes a second set of bonding pads;
   the optical detector being attached to the substrate by solder joints formed between the first and second sets of bonding pads, the solder joints including a first set of solder joints and a second set of solder joints;
   the second set of solder joints being larger than the first set of solder joints, causing the optical detector to be attached at an angle with respect to the substrate.

2. The optical receiver module of claim 1, wherein the angle is between 3 and 15 degrees.

3. The optical receiver module of claim 1, wherein the optical detector is a PIN diode.

4. The optical receiver module of claim 1, wherein the substrate is an integrated circuit.

5. The optical receiver module of claim 4, wherein the integrated circuit includes an integrated transimpedance amplifier circuit (TiA).

6. The optical receiver module of claim 1, wherein the solder joints include a third set of solder joints, the solder joints of the third set being of nearly the same height.

* * * * *